United States Patent
Kanemoto et al.

[11] Patent Number: 5,863,325
[45] Date of Patent: Jan. 26, 1999

[54] PROCESS FOR PRODUCING HIGH PURITY SILICON CARBIDE POWDER FOR PREPARATION OF A SILICON CARBIDE SINGLE CRYSTAL AND SINGLE CRYSTAL

[75] Inventors: Masashi Kanemoto; Shinobu Endo; Masao Hashimoto, all of Kodaira, Japan

[73] Assignee: Bridgestone Corporation, Tokyo, Japan

[21] Appl. No.: 534,847

[22] Filed: Sep. 27, 1995

[30] Foreign Application Priority Data

May 31, 1995 [JP] Japan .................................. 7-134263

[51] Int. Cl.⁶ .................................................. C30B 29/36
[52] U.S. Cl. .............................. 117/105; 117/951; 501/87; 501/88; 423/345
[58] Field of Search ................................... 117/105, 957; 501/88, 87; 423/345

[56] References Cited

U.S. PATENT DOCUMENTS 4,996,174  2/1991  Birchall et al. ............................ 501/88
5,433,167  7/1995  Furukawa et al. ...................... 117/951

FOREIGN PATENT DOCUMENTS 5-24818  2/1993  Japan .
6-219896 8/1994  Japan .

OTHER PUBLICATIONS

WPI Abstract 94–252502/31 of JP060183718 A Bridgestone Jul. 5, 1994.
WPI Abstract 86–240922/37 of JP610168514 A Bridgestone Jul. 30, 1986.

*Primary Examiner*—Robert Kunemund
*Attorney, Agent, or Firm*—Oliff & Berridge, PLC

[57] ABSTRACT

A process for producing high purity silicon carbide uses a high purity tetraethoxysilane or the like as the silicon source and a novolak-type phenol resin or the like as the carbon source. The process comprises a step of forming silicon carbide in which silicon carbide powder is prepared by calcining a mixture of these sources in a non-oxidizing atmosphere, and a step of post-treating silicon carbide in which the silicon carbide powder thus obtained is treated by heating at a temperature of 2000° to 2100° C. for 5 to 20 minutes at least once while the silicon carbide powder is kept at a temperature of 1700° or higher to lower than 2000° C., to obtain silicon carbide powder having an average particle diameter of 10 to 500 μm and a content of impurity elements of 0.5 ppm or less. The high purity silicon carbide powder is advantageously used as a material for producing an excellent silicon carbide single crystal having a decreased number of crystal defects.

12 Claims, 2 Drawing Sheets

PROCESS FOR PRODUCING HIGH PURITY SILICON CARBIDE POWDER FOR PREPARATION OF A SILICON CARBIDE SINGLE CRYSTAL AND SINGLE CRYSTAL

FIELD OF THE INVENTION

The present invention relates to a process for producing high purity silicon carbide powder which is used to grow, with better characteristics, a silicon carbide single crystal having excellent properties such as a large forbidden band width and a large electric field required for dielectric breakdown and is expected to be useful for enhancing performances of semi-conducting devices, and a silicon carbide single crystal prepared by using the high purity silicon carbide powder obtained by the process as a starting material.

PRIOR ART OF THE INVENTION

As a process for producing a silicon carbide single crystal, the modified Lely process (a modified sublimation recrystallization process) in which a silicon carbide single crystal is obtained by sublimation of silicon carbide powder on a seed crystal of silicon carbide at a high temperature of 2000° C. or higher in high purity graphite vessel, has heretofore been known.

As a process for producing silicon carbide powder, on the other hand, the Acheson process in which silicon carbide powder is obtained by using silica sand and petroleum coke as starting materials, has generally been known. However, it has been disclosed that a silicon carbide single crystal obtained by using the silicon carbide powder prepared by this process contains large amounts of impurities, and shows formation of many defects in the crystal, because the starting materials used in this process contain large amounts of impurities [Preprints of Scientific Lectures, Japanese Society of Applied Physics, Volume 51, 29-W-1 (1990)].

It is described in Japanese Patent Application Laid-Open No. Heisei 6(1994)-219896 that a good single crystal can be obtained by using high purity silicon carbide powder containing impurities of 1 ppm or less for growing an n-type silicon carbide single crystal. However, no description can be found at all on a process for producing such high purity silicon carbide powder. Silicon carbide of such high purity is not commercially available. A process for obtaining high purity silicon carbide powder is disclosed in Japanese Patent Application Laid-Open No. Heisei 5(1993)-24818. Decreasing the content of each impurity element to less than 1 ppm in the resultant silicon carbide can be achieved by this process. According to this process, silicon carbide containing impurities of less than 1 ppm can be produced by using a liquid silicon source of high purity and a liquid carbon source as starting materials. However, this process has drawbacks in that a starting material of high purity such as that used in this process is difficult to handle, and that extreme care must be taken to avoid contamination with impurities in processes required for formation of silicon carbide powder. Therefore, it has heretofore been very difficult to obtain high purity silicon carbide powder.

SUMMARY OF THE INVENTION

The present invention accordingly has an object to provide a process for producing silicon carbide powder which contains 0.5 ppm or less of impurities which cause defects and insufficient properties of the single crystal, and can be used as a starting material for preparing a silicon carbide single crystal containing fewer crystal defects and having more excellent electronic properties.

The present invention has another object to provide a process for producing silicon carbide powder which does not show a large decrease in specific surface area and has a particle diameter exhibiting a stable sublimation speed under the condition for growing a single crystal by a sublimation recrystallization process.

The present invention has still another object to provide a silicon carbide single crystal which is prepared by using the silicon carbide powder obtained by the process described above, containing only small amounts of impurities and having an advantageous particle diameter, contains fewer defects in the crystal, and is capable of growing sufficiently.

The objects of the present invention described above can be achieved by a process for producing high purity silicon carbide powder used for preparation of a silicon carbide single crystal comprising: a step of forming silicon carbide in which silicon carbide powder is prepared by calcining, in a non-oxidizing atmosphere, a mixture obtained by homogeneously mixing a silicon source which is one or more types selected from a high purity tetraalkoxysilane, a high purity tetraalkoxysilane polymer, and high purity silicon oxides including silicon monoxide and silicon dioxide, and a carbon source which is a high purity organic compound containing oxygen in the molecule thereof and giving residual carbon after being heated; and a step of post-treating silicon carbide in which the silicon carbide powder thus prepared is treated by heating at a temperature of 2000° to 2100° C. for 5 to 20 minutes at least once while the silicon carbide powder is kept at a temperature of 1700° or higher to lower than 2000° C., to obtain silicon carbide powder having an average particle diameter of 10 to 500 µm and a content of impurity elements of 0.5 ppm or less.

The objects of the present invention described above can also be achieved by the process for producing high purity silicon carbide powder used for preparation of a silicon carbide single crystal described above, wherein the treatment of the silicon carbide powder by heating at a temperature of 2000° to 2100° C. is repeated twice or more intermittently.

The objects of the present invention described above can also be achieved by the process for producing high purity silicon carbide powder used for preparation of a silicon carbide single crystal described above, wherein the carbon source is a liquid substance at an ordinary temperature, or a substance which is softened or converted to a liquid by heating.

The objects of the present invention described above can also be achieved by the process for producing high purity silicon carbide powder used for preparation of a silicon carbide single crystal described above, wherein the mixture is carbonized by heating at 500° to 1000° C. in a non-oxidizing atmosphere before the mixture is calcined in the step of forming silicon carbide.

The objects of the present invention described above can also be achieved by the process for producing high purity silicon carbide powder used for preparation of a silicon carbide single crystal described above, wherein the mixture is cured by heating and/or by using a curing catalyst before the mixture is calcined in the step of forming silicon carbide.

The objects of the present invention described above can also be achieved by the process for producing high purity silicon carbide powder used for preparation of a silicon carbide single crystal described above, wherein 0.5 to 5% by weight of a halogen compound is added to the mixture.

The objects of the present invention described above can also be achieved by the process for producing high purity silicon carbide powder used for preparation of a silicon carbide single crystal described above, wherein 1 to 5% by volume of a halogen or a hydrogen halide is added to the non-oxidizing atmosphere in the calcination in the step of forming silicon carbide, and the silicon carbide powder obtained after the step of post-treating silicon carbide has a content of each impurity element of 0.3 ppm or less.

The objects of the present invention described above can also be achieved by the process for producing high purity silicon carbide powder used for preparation of a silicon carbide single crystal described above, wherein, while the mixture is calcined in a non-oxidizing atmosphere in the step of forming silicon carbide, a constant stream of a non-oxidizing gas is passed through a heating furnace used for calcining the mixture, and a gas mixture containing SiO and CO formed during the calcination is removed from the heating furnace with the stream of a non-oxidizing gas.

The objects of the present invention described above can also be achieved by a silicon carbide single crystal which is prepared by growing silicon carbide powder on a seed crystal with sublimation recrystallization, has a density of defects of $5 \times 10^2/cm^2$ or less, and has a hexagonal structure or a hexagonal structure containing a rhombohedral structure as a part thereof, the silicon carbide powder being high purity silicon carbide powder for preparation of a silicon carbide single crystal prepared by any one of the processes for producing high purity silicon carbide powder for preparation of a silicon carbide single crystal described above.

DETAILED DESCRIPTION OF THE INVENTION

Extensive investigations were undertaken by the present inventors to achieve the objects described above. In the investigations, attention was paid to a temperature pattern of calcination (a thermal history) as well as increase in purity for producing high purity silicon carbide powder using a high purity silicon source and a high purity carbon source. It was discovered that impurities migrate to peripheral area of particles in a process of particle growth which takes place while silicon carbide powder formed in the calcination step is further kept at a temperature of 1700° C. or higher to lower than 2000° C., that highly efficient removal of impurities can be achieved by further growth of the particles and decomposition with sublimation of the surface which arises from heat treatment of the silicon carbide powder at 2000° C. to 2100° C. for 5 to 20 minutes, and that a stable high purity silicon carbide powder can be obtained as the result. The present invention has been completed on the basis of the discoveries.

The present invention is described in detail in the following.

In the present invention, one or more types selected from a high purity tetraalkoxysilane, a high purity polymer thereof, and high purity silicon oxide, are used as the silicon source. Specific examples of the silicon source include alkoxysilanes, such as tetraethoxysilane and the like, low molecular weight polymers (oligomers) thereof, high molecular weight polymers of silicic acid, silica sol, fine powder silica, and the like. Examples of the alkoxysilane include methoxysilane, ethoxysilane, propoxysilane, butoxysilane, and the like. Among these compounds, ethoxysilane is preferable in view of easiness in handling.

The oligomer is a polymer having a degree of polymerization of about 2 to about 15.

Among the silicon sources described above, an oligomer of tetraethoxysilane and a mixture of an oligomer of tetraethoxysilane and a fine powder silica are preferable in view of uniformity and easiness in handling. The silicon source should be of high purity; the content of an impurity in the initial silicon source (before any reaction has taken place) is preferably 20 ppm or less, more preferably 5 ppm or less.

As the carbon source, a high purity organic compound which contains oxygen and gives residual carbon after being heated is used. Examples of the carbon source include phenol resins, furan resins, epoxy resins, phenoxy resins, monosuccharides such as glucose and the like, oligosuccharides such as cane sugar and the like, polysuccharides such as cellulose, starch, and the like. To achieve uniform mixing with the silicon source, a substance which is liquid at an ordinary temperature or dissolved in a solvent, or a substance which is softened or converted to a liquid form by heating, such as a thermoplastic substance and a heat melting substance, is preferably used as the carbon source. Among these carbon sources, resol-type phenol resins and novolak-type phenol resins are preferable.

In the present invention, when a uniform mixture is prepared by mixing a silicon source and a carbon source, the mixture may be converted into a solid form by curing, if necessary. For example, when a carbon source of a liquid form is used as described above, a uniform mixture of a silicon source and the carbon source is cured to convert the mixture into a solid form, and the resultant solid mixture is subsequently used in the process for preparing silicon carbide powder. Examples of the process for curing a mixture include crosslinking by heating, curing by using a curing catalyst, and curing with an irradiation of electron beam or radiation. When a phenol resin or a furan resin is used as the carbon source, an acid, such as toluenesulfonic acid, toluenecarboxylic acid, acetic acid, oxalic acid, hydrochloric acid, sulfuric acid, or the like, or an amine, such as hexamine or the like, can be used as the curing catalyst. When a sugar is used as the carbon source, it is preferred that the sugar is converted into an insoluble form by heating in the presence of ozone or in an atmosphere of air, and the resultant sugar of an insoluble form is subsequently used in the process of cabonization in a non-oxidizing atmosphere.

In the present invention, a halogen compound may be added to a mixture of the sources in an amount of 0.5 to 5% by weight in order to increase the purity and enhance the uniformity further. By adding a halogen compound to the mixture of the sources, impurities formed in the step of forming silicon carbide are halogenated, and the halogenated impurities are removed by vaporization in the step of post-treating silicon carbide. This treatment is particularly effective for removing impurities contained in the starting materials. When a content of an impurity in the starting materials is 5 ppm or less based on the amount of the silicon carbide, the content of the impurity can be reduced to 0.5 ppm or less after the treatment.

It is most suitable that the halogen compound is added to the mixture of the sources when the sources are mixed together. When the sources are mixed in a liquid form or as an aqueous solution, it is preferred that the halogen compound is added in a liquid form containing no impurity, such as an aqueous solution of ammonium chloride or hydrochloric acid. When a thermoplastic phenol resin or a thermoplastic furan resin is used as the carbon source and a solid substance is used as the silicon source, it is preferred that a polymer containing a halogen, such as polyvinyl chloride, chlorinated polyethylene, polychloroprene, or the like, is added as the halogen compound.

When a halogen compound is added, the halogen compound is decomposed and reacts with impurities during the period of temperature increase for the carbonization of a cured solid mixture of the sources, or for the calcination in the case of direct calcination of a mixture of the sources. The reaction product is disposed from the system, and the impurities are removed as the result. It is preferred for more efficient removal of impurities that a halogen compound is allowed to react at a temperature in the vicinity of a decomposition temperature of the halogen compound for 10 to 30 minutes before the temperature is increased to a specified temperature for calcination.

Contents of impurity elements can also be decreased to 0.3 ppm or less by adding 1 to 5% volume of a halogen or a hydrogen halide to the non-oxidizing atmosphere in the calcination in the step of forming silicon carbide. This treatment is effective for removing all impurities present in the steps before the calcination, and exhibits sufficient effect when the impurities are contained in amounts of 20 ppm or less.

In the present invention, a step of carbonizing the solid mixture of the sources by heating at 500° to 1000° C. in a non-oxidizing atmosphere (a step of preliminary carbonization by heating and calcination) may be added before the mixture is calcined in the step of forming silicon carbide. When a halogen compound is added as described above, it is preferred that a two-step carbonization (steps of preliminary carbonization by heating and calcination) is conducted, wherein the mixture of the starting materials is heated in a non-oxidizing atmosphere at a temperature of 500° C. to 600° C. for 10 to 30 minutes, and subsequently heated in a non-oxidizing atmosphere at a temperature of 800° C. to 1000° C. for 30 minutes to 2 hours. When the heating at a temperature of 800° C. to 1000° C. is conducted for less than 30 minutes, sufficient effect of the heating expected for the pre-treatment is not obtained. Even though this heating is conducted for more than 2 hours, further increase in the effect of the heating is not exhibited. For the non-oxidizing atmosphere, nitrogen or argon is used. Nitrogen is preferable for the economic reason.

The step of forming silicon carbide is described in detail.

Silicon carbide powder is formed by calcining a mixture of the sources without any preliminary treatment, a mixture of the sources obtained after the preliminary carbonization, or a mixture of the sources which has been converted into a solid form by curing, in a non-oxidizing atmosphere in the step of forming silicon carbide. In other words, silicon carbide powder is formed by calcining a solid product of the preliminary carbonization, or by directly calcining a mixture of the sources without preliminary carbonization. For the non-oxidizing atmosphere in this step, argon is preferably used because it is not reactive even at a high temperature. In the step of the calcination, it is necessary in order to form silicon carbide that the solid material be heated to a temperature required for the formation of silicon carbide. The solid material is generally heated at 1350° to 1800° C., and preferably at 1600° to 1800° C. for more effective formation of silicon carbide. Because the reaction for the formation of silicon carbide is an endothermic reaction, measurement of the temperature of the product must be made with caution.

A gas mixture containing SiO and CO which is generated during the calcination contains large amounts of impurity elements. Therefore, it is preferred that a constant stream of a non-oxidizing gas is suitably passed through the heating furnace used for the calcination, and the gas generated is constantly removed by disposing to the outside of the reaction vessel.

In order to grow the silicon carbide particles thus formed in the subsequent step of post-treating silicon carbide, it is preferred that silicon carbide is heated to a suitably high temperature, and kept at the temperature. The heating is conducted at a temperature of 1700° C. or higher to lower than 2000° C. It has been made clear by analysis of impurities that the impurities migrate to parts in the vicinity of the surface of a particle of silicon carbide while the number of crystallite in the particle increases and the particle grows by the heating.

By heat treating the silicon carbide powder prepared in the step of formation of silicon carbide at a temperature of 2000° C. to 2100° C. for 5 to 20 minutes at least once while the silicon carbide powder is kept at a temperature of 1700° or higher to lower than 2000° C., the impurities distributed in the parts in the vicinity of the surface of a particle are removed to the outside of the system while the particle grows further and partial decomposition with sublimation takes place. Thus, the silicon carbide powder achieving the aimed purity can be obtained.

The heat treatment at a temperature of 2000° C. to 2100° C. for 5 to 20 minutes, which is conducted in the step of post-treating a silicon carbide after the step of forming a silicon carbide, is preferable in view of controlling a crystal diameter as well as removing impurities. By the heating in this treatment, further growth of the particles takes place, and powder having a desired particle diameter can be obtained. When the temperature of the heat treatment is lower than 2000° C., removal of impurities is insufficient. When the temperature is higher than 2100° C., decomposition of silicon carbide proceeds excessively, and there arises possibility that a uniform product is not obtained. Therefore, a temperature at the outside of the specified range is not preferable.

The heat treatment at a temperature of 2000° C. to 2100° C. in the step of post-treating a silicon carbide may be conducted, for example, only once for 5 to 20 minutes, or may be repeated while the silicon carbide powder is kept at a temperature of 1700° or higher to lower than 2000° C. When the heat treatment is repeated, for example, the silicon carbide powder is heated to a temperature of 2000° to 2100° C. from the temperature of 1700° or higher to lower than 2000° C., kept at this temperature for 5 to 20 minutes, subsequently cooled to the temperature of the atmosphere which is 1700 or higher to lower than 2000° C., kept at this temperature for a specified time, and then these operations including heating, keeping a high temperature, cooling, and keeping a temperature of the atmosphere, are repeated by a desired number of times. When the heat treatment is repeated, it is preferred that the silicon carbide powder is kept at a temperature of 2000° C. to 2100° C. for 5 to 20 minutes in each heat treatment. When the temperature of the heat treatment is lower than 2000° C., removal of impurities is insufficient. When the temperature is higher than 2100° C., decomposition of silicon carbide proceeds excessively, and there arises possibility that a uniform product is not obtained. When the heat treatment is repeated several times, it is preferred that the silicon carbide powder is heated to a temperature of 2000° C. to 2100° C. from the temperature of the atmosphere which is 1700° C. or higher to lower than 2000° C., kept at this temperature for 5 to 20 minutes, subsequently cooled to the temperature of the atmosphere which is 1700° C. or higher to lower than 2000° C., kept at this temperature for a specified time, and then these operations including heating, keeping a high temperature, cooling, and keeping a temperature of the atmosphere, are repeated at the same interval between the heating operations while the temperature of the atmosphere is kept at 1700° C. or higher to lower than 2000° C. When the silicon carbide powder is heated to a temperature of 2000° C. to 2100° C., kept at this temperature for 5 to 20 minutes, cooled to the temperature of the atmosphere, and then these operations are repeated, it is preferred that the silicon carbide powder is kept at the temperature of the atmosphere for a time twice or more as long as the time kept at a temperature of 2000° C. to 2100° C. before being heated again. When the heating is repeated several times, it is also preferred that total of the time kept at a temperature of 2000° C. to 2100° C. is 60 minutes or less. It is preferred that the time of heating at a temperature of 2000° C. to 2100° C. is selected within the ranges described above. It is more preferred that a longer time is selected within the ranges described above when the temperature of the heating is closer to 2000° C., and—shorter time is selected within the ranges described above when the temperature of the heating is closer to 2100° C.

It has been known that decomposition of silicon carbide generally begins at a temperature higher than 2000° C. under a pressure of 1 atmosphere. However, the aimed purity and the aimed particle diameter can be achieved by adjusting the time of the heating and the time of the interval between the heating even when the temperature is higher than 2000° C.

In the present invention, the apparatus of production and the type of operation, such as a continuous operation and a batch operation, are not particularly limited so long as the heating conditions of the present invention described above are satisfied. Therefore, the calcination in the step of forming a silicon carbide and the heating in the step of post-treating a silicon carbide may be conducted continuously in a single heating furnace with control of conditions, such as temperature and time, or may be conducted separately by transferring the silicon carbide powder formed by the step of forming silicon carbide powder to a separate heating furnace for the heat treatment in the next step of post-treating a silicon carbide.

It is considered that a content of an impurity as low as 0.5 ppm or less can be achieved with stability by the presence of the step of post-treating a silicon carbide at a very high temperature after the silicon carbide is formed in the step of forming a silicon carbide, because the impurity is removed by the heat treatment in the step of post-treating a silicon carbide even when some increase in the impurity arises in the step of forming a silicon carbide. However, a process control for preventing contamination with impurities is necessary because it is difficult to achieve a content of an impurity of 0.5 ppm or less in the obtained silicon carbide powder when the amount of the impurity added by the contamination in the intermediate steps is more than 2 ppm based on the amount of the silicon carbide. Nevertheless, it is clearly shown that stability of purity which is indicated by variation in the content of an impurity is better in the process of the present invention than in a process having no heat treatment at a temperature of 2000° to 2100° C., and that a more uniform silicon carbide powder containing less impurities can be obtained. The average particle diameter of the silicon carbide powder obtained by the process of the present invention has a larger value of 10 to 500 μm in comparison with the corresponding value of 5 μm or less of silicon carbide powder obtained by a conventional process having the calcining step alone. Distribution of the particle size is also more uniform than that obtained by a conventional process.

As for purity of the silicon source and the carbon source used as the starting materials in the process of the present invention, it is preferred that the sources each contain 1 ppm or less of each impurity element. However, the purity is not limited to this range so long as the purity is in a range which the purification process in the heating steps allows. The impurity element is an element belonging to elements of Groups 1 to 16 in the Periodic Table according to the Revised Nomenclature in Inorganic Chemistry published by IUPAC in 1989, having an atomic number of 3 or more, and excluding elements having atomic numbers of 6 to 8 and 14 to 16.

In the present invention, the ratio of carbon to silicon (referred to as the C/Si ratio, hereinafter) is defined as the ratio of carbon to silicon obtained by elemental analysis of a carbonized intermediate substance prepared by carbonizing a cured solid mixture of a silicon source and a carbon source. It is predicted by the stoichiometry that the content of free carbon in a silicon carbide formed be 0% when the C/Si ratio is 3.0. However, some amount of free carbon is formed even when the C/Si ratio is lower than 3.0 because of vaporization of SiO gas formed during the heating. Therefore, it is important that amounts of the silicon source and the carbon source used are determined in advance in such a manner that the silicon carbide powder formed does not contain free carbon in an amount not suitable for preparation of a single crystal. When the calcination is conducted at a temperature of 1600° C. or higher at a pressure of around 1 atmosphere, the C/Si ratio is preferably in the range of 2.0 to 2.5 because the formation of free carbon can generally be prevented when the C/Si ratio is in this range. When the C/Si ratio is more than 2.5, the amount of free carbon increases remarkably. Since free carbon shows an effect of suppressing growth of particles, a C/Si ratio of more than 2.5 may be suitably selected according to the purpose in forming particles. When the calcination is conducted at a decreased or increased pressure of the atmosphere, the C/Si ratio suitable for obtaining high purity silicon carbide may be different from the value described above. In this case, the C/Si ratio is not necessarily limited to the range described above.

The average particle diameter of the silicon carbide obtained by the process of the present invention is 10 to 500 μm, preferably 30 to 200 μm. When the average particle diameter is less than 10 μm, sintering takes place at the sublimation temperature of silicon carbide (2000° to 5000° C.) which is required for the formation of a single crystal of silicon carbide, and a surface area for the sublimation is decreased to cause slower growth of the single crystal. When the average particle diameter is more than 500 μm, growth of the single crystal is decreased because the specific surface area of the particles is decreased.

For obtaining the silicon carbide single crystal of the present invention by using the high purity silicon carbide powder obtained by the process of the present invention, a conventional process, such as the modified Lely process, can be used. In such a process, for example, a plate of a single crystal having an Si surface exposed by polishing is placed at an upper cover of a graphite vessel, which is filled with the silicon carbide powder obtained by the process described above, and growing of a single crystal is performed by the sublimation recrystallization process.

In order to confirm that the single crystal obtained from the high purity silicon carbide powder prepared by the process of the present invention is superior to a single crystal obtained from silicon carbide powder prepared by a conventional process, growing of a single crystal was conducted by the modified Lely process (a sublimation recrystallization process using a seed crystal) in the following examples.

EXAMPLES

The invention will be understood more readily with reference to the following examples; however, these examples are intended to illustrate the invention and are not to be construed to limit the scope of the invention.

Preparation of Silicon Carbide Powder

Example 1

A mixture of 680 g of a high purity ethyl silicate oligomer containing 40% of $SiO_2$ and 305 g of a high purity liquid resol-type phenol resin having a water content of 20% was prepared. After 137 g of a 28% aqueous solution of high purity p-toluenesulfonic acid was added to the mixture, the mixture was cured by drying to obtain a uniform resinous solid. This product was carbonized at 900° C. for 1 hour in a nitrogen atmosphere. The result of the elemental analysis of the carbonized product showed that the product had a C/Si ratio of 2.40.

In a vessel made of carbon, 400 g of the product obtained above was placed. The product was heated to 1750° C. in an argon atmosphere, kept at 1750° C. for 30 minutes, then heated to 1850° C., and kept at 1850° C. for 1 hour. After the product had been kept at 1850° C. for 15 minutes, the product was heated to 2030° C., kept at 2030° C. for 5 minutes, and then cooled to 1850° C. The operations of heating to 2030° C., keeping at 2030° C. for 5 minutes, and then cooling to 1850° C., were repeated 3 times at an equal interval of 15 minutes during the period of 1 hour described above. In more detail, the product was heated to 1850° C., kept at 1850° C. for 15 minutes, then heated to 2030° C., kept at 2030° C. for 5 minutes, cooled to 1850° C., kept at 1850° C. for 15 minutes, heated to 2030° C. again, kept at 2030° C. for 5 minutes, cooled to 1850° C., kept at 1850° C. for 15 minutes, heated to 2030° C. again, kept at 2030° C. for 5 minutes, and finally cooled to 1850° C.. Powder thus obtained was yellowish green.

Figure 2:
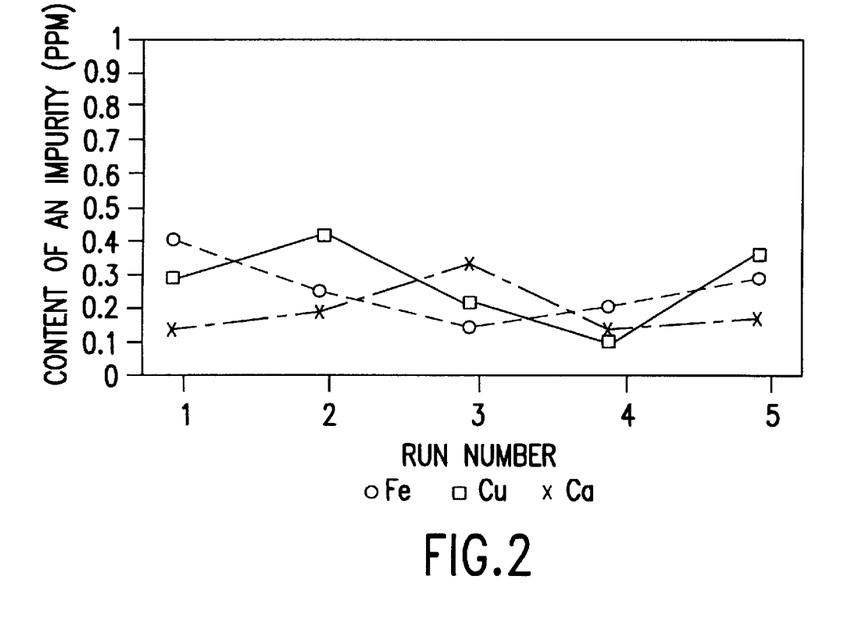
FIG. 2 illustrates a graph showing contents of impurities in silicon carbide powder obtained in Example 1.

Impurities in the powder obtained was analyzed by heat decomposition of the powder with a mixed acid containing fluorine, nitric acid, and sulfuric acid under a pressure, followed by analysis by using the ICP-mass analysis method and the flameless atomic-absorption spectroscopy method. The average particle diameter of the powder was measured by using an apparatus for measuring particle size distribution (TSUB-TEC). To examine variation in the analyses, these operations were repeated in five runs. The result of the third run of the impurity analysis is shown in Table 1. Contents of iron, copper, and calcium as the impurities obtained by the analysis are shown in FIG. 2. As is apparent from FIG. 2, it was confirmed that the contents of the impurities were less than 0.5 ppm in all cases examined, and the variations in the contents were small. The average particle diameter of the powder obtained was 50 to 80 μm.

Comparative Example 1

Figure 3:
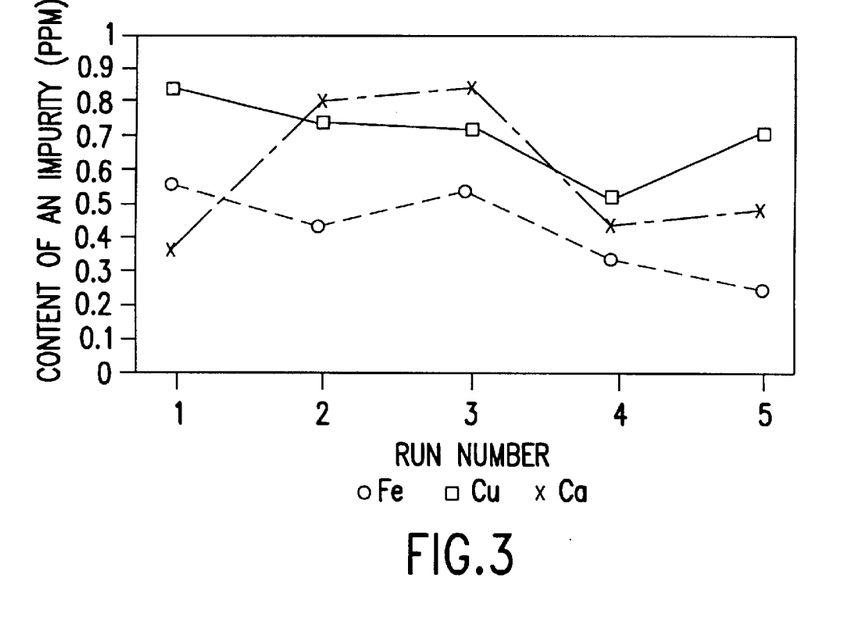
FIG. 3 illustrates a graph showing contents of impurities in silicon carbide powder obtained in Comparative Example 1.

Silicon carbide powder was prepared by the same procedure as that in Example 1 except that the product was always kept at 1850° C. without the operations of heating to 2030° C., keeping at 2030° C. for 5 minutes, and cooling to 1850° C. The preparation was repeated in five runs to examine variation. The result of the analysis of impurities in the third run is shown in Table 1. Contents of iron, copper, and calcium as the impurities obtained by the analysis are shown in FIG. 3. As is apparent from FIG. 3, it was confirmed that the maximum contents of the impurities exceeded 0.8 ppm, and the variations of the contents were as large as 0.3 to 0.8 ppm. The average particle diameter of the powder obtained was 3 to 10 μm.

Example 2

Silicon carbide powder was prepared by the same procedure as that in Example 1 except that 80 g of the aqueous solution of toluenesulfonic acid was added in place of 137 g of the aqueous solution of toluenesulfonic acid, 60 g of a 20% aqueous solution of hydrochloric acid was added to supplement the decrease in the aqueous solution of toluenesulfonic acid, and the carbonization was conducted in two stages of 500° C., 20 minutes and 900° C., 40 minutes. The powder obtained was evaluated by the same methods as those in Example 1. The results of the analysis of impurities are shown in Table 1. The average particle diameter of the powder obtained was 40 to 75 μm.

Example 3

Silicon carbide powder was prepared by the same procedure as that in Example 1 except that 2% of chlorine gas was added to the argon atmosphere for the calcination in the first step. The powder obtained was evaluated by the same methods as those in Example 1. The results of the analysis of impurities are shown in Table 1. The average particle diameter of the powder obtained was 45 to 70 μm.

Example 4

Silicon carbide powder was prepared by the same procedure as that in Example 3 except that iron, copper, calcium, and sodium in the form of an oxide or a hydroxide were added to the mixture of the starting materials during the mixing in advance in such amounts that contents of each of iron, copper, calcium, and sodium were 5, 10, 15, and 20 ppm based on the amount of the silicon carbide of the final product. The results of the analysis of impurities are shown in Table 2.

Comparative Example 2

Silicon carbide powder was prepared by the same procedure as that in Comparative Example 1 except that iron, copper, calcium, and sodium in the form of an oxide or a hydroxide were added to the mixture of the starting material during the mixing in advance in such amounts that contents of each of iron, copper, calcium, and sodium were 1, 2, 4, and 6 ppm based on the amount of the silicon carbide of the final product. The results of the analysis of impurities are shown in Table 2.

Example 5

Silicon carbide powder was prepared by the same procedure as that in Example 1 except that the product of the first step was kept at 1900° C. for 3.5 hours in place of being kept at 1850° C. for 1 hour, and heat treated as following during the period of 3.5 hour described above: the product of the first step was kept at 1900° C. for 10 minutes, heated to 2100° C., kept at 2100° C. for 10 minutes, then cooled to 1900° C., and kept at 1900° C. for 20 minutes, and these operations were repeated 6 times at an equal interval of 20 minutes by heating the product again to 1900° C. The powder obtained was evaluated by the same method as that in Example 1. The results of the analysis of impurities are shown in Table 1. The average particle diameter of the powder obtained was 200 to 300 μm.

Comparative Example 3

Silicon carbide powder was prepared by the same procedure as that in Example 5 except that the product of the first step was kept at 1900° C. for 6 hours in place of being kept at 1900° C. for 3.5 hour, and heat treated by being kept at 2100° C. for 25 minutes in place of being kept at 2100° C. for 10 minutes. Crude large particles were formed by abnormal growth on the surface of the powder particles. This crude large particles were separated and ground, and a powder of a diameter of 0.5 to 2.5 mm was obtained. The powder thus obtained was used for preparation of a silicon carbide single crystal in Comparative Example 8 as the material for growing a single crystal.

Example 6

By using a heated mill coated with teflon, 430 g of a high purity novolak-type thermoplastic phenol resin and 552 g of high purity $SiO_2$ having a particle diameter of 1 μm or less were mixed together uniformly. To this mixture, 80 g of hexane was further mixed by the mill, and the mixture obtained was cured at 150° C. for 20 minutes. The solid product thus obtained was carbonized in a nitrogen atmosphere at 900° C. for 1 hour, to obtain an intermediate carbonized product. The carbonized product had a C/Si ratio of 2.45.

Silicon carbide powder was prepared by the same procedure as that in Example 1 except that the intermediate carbonized product was kept at 1850° C. for 25 minutes, heated to 2030° C., kept at 2030° C. for 8 minutes, and then cooled to 1850° C., and these operations were repeated 4 times at an interval of 25 minutes while the product was kept at 1850° C. for 2.5 hours. The powder obtained was evaluated by the same methods as those in Example 1. The results of the analysis of impurities are shown in Table 1. The average particle diameter of the powder obtained was 100 to 150 μm.

Comparative Example 4

Silicon carbide powder was prepared by the same procedure as that in Example 6 except that the product was always kept at 1850° C. without the operations of heating to 2030° C., keeping at 2030° C. for 8 minutes, and cooling to 1850° C. The powder obtained was evaluated by the same methods as those in Example 1. The results of the analysis of impurities are shown in Table 1. The average particle diameter of the powder obtained was 8 to 20 μm.

Example 7

Silicon carbide powder was prepared by the same procedure as that in Example 6 except that 40 g of polyvinyl chloride was added to the mixture of the sources when the mixture was prepared by mixing the sources with a mill, and 1% by volume of chlorine gas was added to the atmosphere in the step of forming silicon carbide by calcination of the mixture in an argon atmosphere. The powder obtained was evaluated by the same methods as those in Example 1. The results of the analysis of impurities are shown in Table 1. The average particle diameter of the powder obtained was 110 to 180 μm.

Comparative Example 5

A green silicon carbide powder for polishing #100 prepared by the Acheson process (a product of Yakushima Denkosha, Ltd., DIASIC, average particle diameter: 150 μm) was washed well with a high purity solution of hydrochloric acid containing no impurity, dried, and treated for purification at 2000° C. for 30 minutes. The results of the analysis of impurities in the powder obtained are shown in Table 1.

Comparative Example 6

A commercial β-type silicon carbide powder (a product of H. C. Starck Company, average particle diameter: 2 μm) was treated for purification by the same procedure as that in Comparative Example 5. The results of the analysis of impurities in the powder obtained are shown in Table 1.

TABLE 1

| | Contents of Impurity Elements in Silicon Carbide Powder*[1] (ppm) | | | | | | | | | |
|---|---|---|---|---|---|---|---|---|---|---|
| Example | 1 | 2 | 3 | 5 | 6 | 7 | — | — | — | — |
| Comparative Example | — | — | — | — | — | — | 1 | 4 | 5 | 6 |
| impurity element | | | | | | | | | | |
| B  | <0.1 | <0.1 | <0.1 | <0.1 | 0.15 | <0.1 | <0.1 | <0.1 | 10 | <1.50 |
| Na | 0.18 | <0.1 | <0.1 | <0.1 | 0.20 | <0.1 | 0.15 | 0.38 | 60 | 0.20 |
| K  | <0.1 | <0.1 | <0.1 | <0.1 | 0.15 | <0.1 | <0.1 | <0.1 | 12 | <0.1 |
| Al | 0.42 | 0.20 | <0.1 | 0.15 | 0.45 | <0.1 | 0.65 | 1.86 | 90 | 1.26 |
| Cr | 0.15 | <0.1 | <0.1 | <0.1 | 0.30 | <0.1 | 0.10 | 0.43 | 15 | 0.52 |
| Fe | 0.23 | <0.1 | <0.1 | <0.1 | 0.30 | <0.1 | 0.71 | 2.00 | 45 | 0.42 |
| Ni | 0.14 | <0.1 | <0.1 | <0.1 | 0.20 | <0.1 | 0.32 | 0.53 | 25 | 0.20 |
| Cu | 0.15 | 0.13 | <0.1 | 0.12 | 0.25 | <0.1 | 0.52 | 1.32 | 60 | 0.20 |
| W  | <0.1 | <0.1 | <0.1 | <0.1 | <0.1 | <0.1 | <0.1 | 0.17 | 3  | 2.12 |
| Ti | 0.27 | <0.1 | <0.1 | <0.1 | 0.30 | <0.1 | 0.22 | 0.33 | 5  | 0.30 |
| Ca | 0.35 | 0.20 | <0.1 | 0.16 | 0.45 | <0.1 | 0.65 | 1.45 | 70 | 0.70 |

*[1]: <0.1 shows a content lower than the detecting limit in the measurement.

TABLE 2

Contents of Impurity Elements in Silicon Carbide Powder*[1] (ppm) When the Impurity Elements were added to the Mixture of Starting Materials

| impurity element | Example 4 initial concentration of added impurity element (ppm) | | | | Comparative Example 2 initial concentration of added impurity element (ppm) | | | |
|---|---|---|---|---|---|---|---|---|
| | 5 | 10 | 15 | 20 | 1 | 2 | 4 | 6 |
| Fe | <0.1 | <0.1 | 0.10 | 0.15 | 0.8 | 1.5 | 3.3 | 5.2 |
| Cu | <0.1 | <0.1 | 0.15 | 0.25 | 1.2 | 1.8 | 2.8 | 5.8 |
| Ca | <0.1 | <0.1 | <0.1 | 0.21 | 1.5 | 2.2 | 3.01 | 5.8 |
| Na | <0.1 | <0.1 | <0.1 | 0.10 | 0.6 | 1.1 | 1.9 | 3.5 |

*[1]: <0.1 shows a content lower than the detecting limit in the measurement.

As is apparent from the results of measurement of particle diameter and the results in Table 1, the silicon carbide powder obtained in Examples 1 to 3 and 5 to 7 according to the process of the present invention had sufficient average particle diameters and very low contents of impurities. In contrast, the silicon carbide powder obtained in Comparative Examples 1 and 4 to 5 had small particle diameters and showed insufficient decrease in the contents of impurities.

As is apparent from the results in Table 2, the silicon carbide powder obtained in Example 4 prepared according to the process of the present invention showed sufficient removal of impurities even though impurity elements were further added to the mixture of the starting materials. In contrast, the silicon carbide powder obtained in Comparative Example 2 showed almost no removal of impurities even though the amounts of the impurities added to the mixture of the starting materials were less than those in Example 2, and occasionally showed increase in the contents of impurities because of increase in the impurities by contamination in the process. These results show that, according to the process of the present invention, impurities added by contamination in the process can be effectively removed, and silicon carbide powder having low contents of impurities can be obtained as the final product.

Preparation of Silicon Carbide Single Crystals

Figure 1:
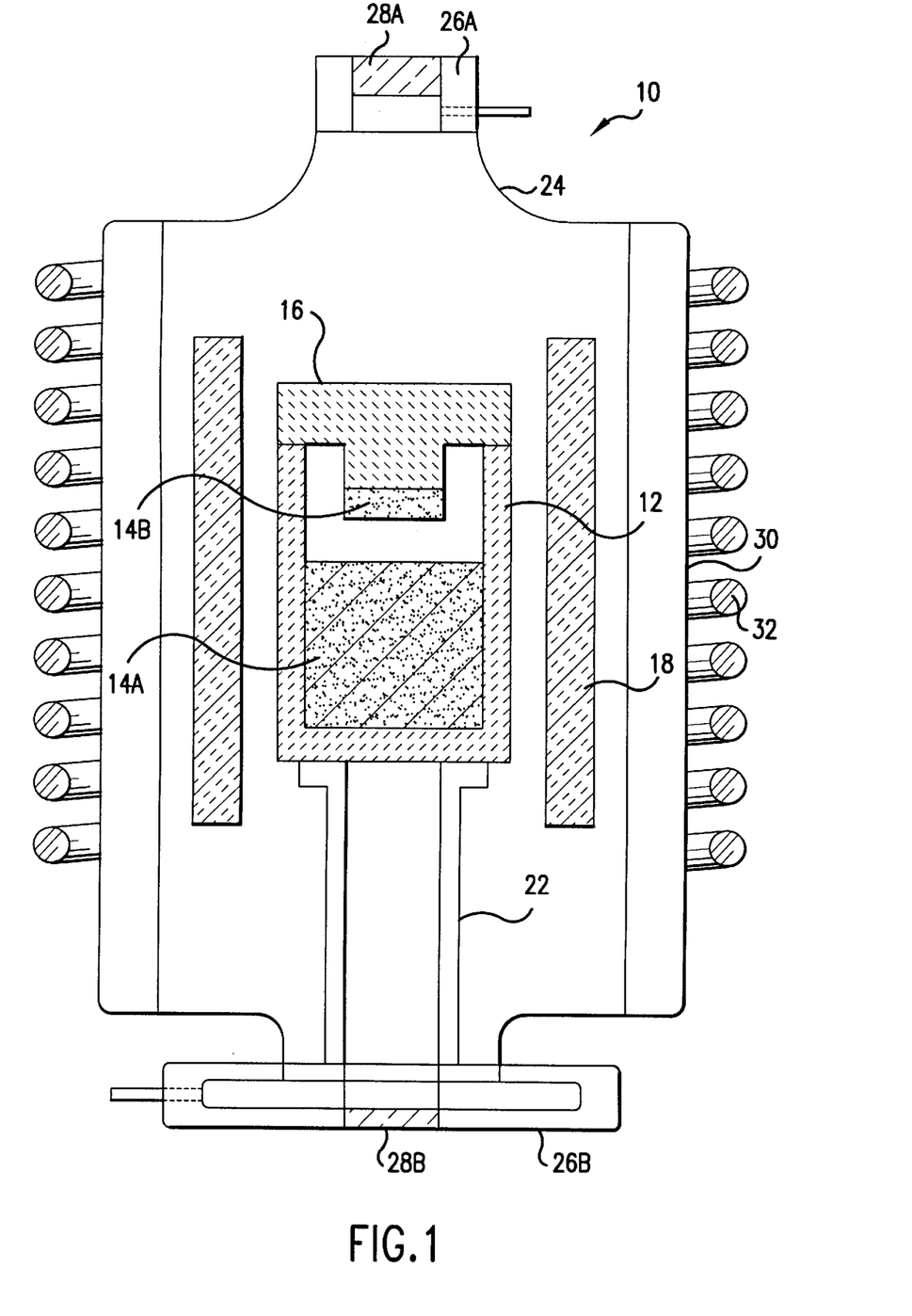
FIG. 1 illustrates a schematic section view showing an apparatus for producing a silicon carbide single crystal in which a silicon carbide single crystal is grown by a modified Lely process.

An apparatus for preparation of a silicon carbide single crystal is described with reference to FIG. 1. FIG. 1 illustrates a schematic section view showing an apparatus 10 for producing a silicon carbide single crystal. A cylindrical graphite vessel 12 is disposed at the center of the apparatus 10 for producing a silicon carbide single crystal. Silicon carbide powder 14A used as the material is placed in the cylindrical graphite vessel 12, and the vessel is closed with a graphite cover 16. At the inside of the graphite cover 16, a seed crystal 14B for growing a single crystal is placed. Around periphery of the cylindrical graphite vessel 12, a heat insulator 18 made of graphite felt or graphite foam is disposed to stabilize temperature in the vessel 12. The cylindrical graphite vessel 12 is supported with a hollow supporting frame 22, and disposed in a quartz chamber 24 without making contact with any of wall surfaces, a cover surface, and a bottom surface of the quartz chamber 24. A quartz upper cover 26A is disposed at the upper face of the quartz chamber 24, and a quartz lower cover 26B is disposed at the lower face of the quartz chamber 24. At the center of each of the quartz upper cover 26A and the quartz lower cover 26B, windows for temperature measurement made of quartz 28A, and 28B, respectively, are attached. Side wall 30 of the quartz chamber 12 has a double wall structure so that cooling water can be past through the wall. Control of temperature in the vessel 12 is conducted by passing cooling water in the side wall 30 of the quartz chamber having the double wall structure and by heating with a high frequency coil 32 which heats the graphite vessel. The whole apparatus including the parts described above is disposed in a stainless steel chamber which is not shown in FIG. 1. Control of the inner pressure and substitution of atmospheric gas are conducted by using this stainless steel chamber. An opening 34 is formed at the quartz upper cover and the quartz lower cover of the quartz chamber so that the atmospheres in the stainless steel chamber and in the quartz chamber are kept the same.

It is preferred that a graphite material of high purity is used for the graphite vessel, the graphite cover, and the heat insulator used in the present apparatus in order to keep purity of the single crystal obtained high. Therefore, a graphite material is used as the material after a high purity treatment. More specifically, it is preferred that the graphite material is baked sufficiently at a temperature of 2500° C. or higher in advance so that no impurity is generated at the temperature of growing a single crystal. Growing a single crystal by using the apparatus 10 for producing a silicon carbide single crystal is described in more detail with reference to Examples 8 to 11.

Examples 8 to 11 and Comparative Examples 7 to 10

Silicon carbide powder prepared in Example 1, 3, 5, or 7 or Comparative Example 1, 3, 5, or 6 was placed in the cylindrical graphite vessel 12 shown in FIG. 1 in such as manner that the upper surface of the powder comes to a position about half the height of the vessel. A single crystal plate of a diameter of about 8 mm (with a shape varied in each run) and a thickness of 0.5 to 1 mm which had been cut at the 6H (0001) plane and polished to expose the Si surface, was placed at the upper cover 16 as the seed crystal. The graphite vessel was placed in an induction furnace, and the atmosphere in the vessel was sufficiently substituted with argon. Then, temperature was increased to 1600° C. under argon of 1 atmosphere. After the pressure was slowly reduced to 0.1 Torr or lower and kept at this pressure for 10 to 30 minutes, argon was introduced into the vessel until the pressure reached 10 Torr. Under this condition, the vessel was heated by high frequency induction until the temperature at the bottom of the vessel reached 2320° C. The temperature at the bottom of the vessel was 2320° C. at this time. Growing of a single crystal was conducted in this condition for about 5 hours. By using the silicon carbide powder obtained Examples 1, 3, 5, and 7 and Comparative Example 1, 3, 5, and 6, single crystals were obtained in Examples 8, 9, 10, and 11 and Comparative Examples 7, 8, 9, and 10, respectively. Length to the direction of growth of each single crystal thus obtained is shown in Table 3.

The single crystals obtained were sliced at a part different from the seed crystal as much as possible, in other words, a part having the influence of the seed crystal as little as possible, and the sliced surface was polished to a mirror surface. Defects on the surface were observed after the surface was etched with a molten alkali. Pit-form defects and penetrating defects having a hexagonal hole were found. Number of the defects was counted by counting these two types of defect separately, and an average density of defects was obtained in the area covering 80% of the surface around the center of the single crystal. The density of defects in the present invention indicates a density of defects obtained as the total of the numbers of the pit-form defect and the penetrating defect. The results obtained are shown in Table 3. In Comparative Example 8, a single crystal of a length of 1 mm was obtained, but the single crystal could not be sliced because of the too small size. In Comparative Example 10, a single crystal of a length of 2 mm or shorter was obtained. Sliced surface of this single crystal showed a significantly non-uniform condition, and pits of excessively various sizes and shapes were observed. Therefore, the number of defects could not be counted in Comparative Examples 8 and 10.

Four single crystals (the single crystals obtained in Examples 8 and 9 and Comparative Examples 7 and 9) were selected from the single crystals obtained, and decomposed by heating under pressure using a mixed acid containing hydrofluoric acid and nitric acid. The solutions obtained were concentrated to a concentration 10 times or more of the original concentration, and impurities in the solutions were analyzed by the ICP-mass analysis and the flameless atomic absorption analysis. The results are shown in Table 4.

TABLE 3

Crystal Length and Average Density of Defects of Single Crystals

| | structure of single crystal | length of single crystal mm | number of penetrating defect/ $cm^2$ | number of pit-form defect/ $cm^2$ | density of defects/ $cm^2$ |
|---|---|---|---|---|---|
| Example 8 | hex-agonal*[2] | ~9 | 160 | 320 | 480 |
| Example 9 | hex-agonal*[2] | ~10 | 80 | 210 | 290 |
| Example 10 | hexagonal | ~6 | 110 | 350 | 460 |
| Example 11 | hexagonal | ~8 | 60 | 280 | 340 |
| Comparative Example 7 | hex-agonal*[2] | ~3.5 | 240 | 780 | 1020 |
| Comparative Example 8 | — | 1 or less | unable to count*[1] | unable to count*[1] | unable to count*[1] |
| Comparative Example 9 | hex-agonal*[2] | ~7 | 380 | 2000 or more | 2000 or more |
| Comparative Example 10 | — | 2 or less | unable to count*[1] | unable to count*[1] | unable to count*[1] |

*[1]Number of defects could not be counted because: the single crystal could not be sliced for polishing to a mirror surface; or the sliced surface was not uniform.
*[2]A hexagonal crystal partially containing a rhombohedral structure.

TABLE 4

Contents of Impurity Elements in Single Crystals Grown from Different Types of Material Powder (ppb)

| impurity element | Example 8 material powder of Example 1 | Example 9 material powder of Example 3 | Comparative Example 7 material powder of Comparative Example 1 | Comparative Example 9 material powder of Comparative Example 5 |
|---|---|---|---|---|
| B | <10 | <10 | <10 | 20 |
| Na | 15 | <10 | 20 | 453 |
| K | <10 | <10 | <10 | 85 |
| Al | 30 | <10 | 45 | 283 |
| Cr | <10 | <10 | 14 | 15 |

TABLE 4-continued

Contents of Impurity Elements in Single Crystals Grown from Different Types of Material Powder (ppb)

| impurity element | Example 8 material powder of Example 1 | Example 9 material powder of Example 3 | Comparative Example 7 material powder of Comparative Example 1 | Comparative Example 9 material powder of Comparative Example 5 |
|---|---|---|---|---|
| Fe | 18 | <10 | 35 | 572 |
| Ni | 10 | <10 | 22 | 211 |
| Cu | 11 | <10 | 15 | 75 |
| W | <10 | <10 | <10 | 23 |
| Ti | <10 | <10 | 12 | 55 |
| Ca | 25 | <10 | 85 | 384 |

As is apparent from Table 3, the single crystals obtained by using silicon carbide powder which was not prepared according to the process of the present invention as the material did not have a sufficient length, and even when the single crystals were hexagonal, they were not uniform or had many pit-form defects and penetrating defects. In contrast, the single crystals obtained by using the high purity silicon carbide powder which was prepared according to the process of the present invention as the material were always hexagonal crystals or hexagonal crystals containing the rhombohedral structure as a part thereof, had a sufficient length, and contained few defects, such as the pit-form defect and the penetrating defect.

As is apparent from Table 4, both the single crystal obtained in Comparative Example 7 in which a powder prepared without heat treatment at a high temperature was used and the single crystal obtained in Comparative Example 8 in which a conventional powder prepared by the Acheson process was used, contained large amounts of impurities. In contrast, it can be confirmed that the single crystals obtained by using the high purity silicon carbide powder prepared by the process of the present invention always contained impurities in only very small amounts.

To summarize the advantages of the present invention, silicon carbide powder which is used as a material for preparing a silicon carbide single crystal containing fewer crystal defects and having more excellent electronic properties can be obtained according to the process for producing silicon carbide powder of the present invention. The silicon carbide powder contains impurities in amounts of 0.5 ppm or less, and has a particle diameter which does not cause significant decrease in the specific surface area under the condition of growing the single crystal and shows a stable rate of sublimation. A silicon carbide single crystal of a hexagonal structure containing few crystal defects and having a sufficient length can be obtained by using the silicon carbide powder prepared by the process as the material.

What is claimed is:

1. A process for producing high purity silicon carbide powder used for preparation of a silicon carbide single crystal comprising the steps of:
    forming silicon carbide in which silicon carbide powder is prepared by calcining, in a non-oxidizing atmosphere, a mixture obtained by homogeneously mixing a silicon source which is one or more silicon materials selected from the group consisting of high purity tetraalkoxysilane, high purity tetraalkoxysilane polymer, and high purity silicon oxide, and a carbon source which is a high purity organic compound containing oxygen in the molecule thereof and giving residual carbon after being heated; and post-treating silicon carbide in which the silicon carbide powder thus prepared is treated by heating the silicon carbide powder to a temperature of 2000° to 2100° C. for 5 to 20 minutes at least once while the silicon carbide powder is being maintained at a temperature of 1700° or higher to lower than 2000° C., to obtain silicon carbide powder having an average particle diameter of 10 to 500 μm and a content of impurity elements of 0.5 ppm or less.

2. The process for producing high purity silicon carbide powder used for preparation of a silicon carbide single crystal according to claim 1, wherein the treatment of the silicon carbide powder by heating at a temperature of 2000° to 2100° C. is repeated twice or more intermittently.

3. The process for producing high purity silicon carbide powder used for preparation of a silicon carbide single crystal according to claim 2, wherein the carbon source is a liquid substance at an ordinary temperature, or a substance which is softened or converted to a liquid by heating.

4. The process for producing high purity silicon carbide powder used for preparation of a silicon carbide single crystal according to claim 2, wherein the mixture is carbonized by heating at 500° to 1000° C. in a non-oxidizing atmosphere before the mixture is calcined in the step of forming silicon carbide.

5. The process for producing high purity silicon carbide powder used for preparation of a silicon carbide single crystal according to claim 2, wherein the mixture is cured by heating and/or by using a curing catalyst before the mixture is calcined in the step of forming silicon carbide.

6. The process for producing high purity silicon carbide powder used for preparation of a silicon carbide single crystal according to claim 2, wherein 0.5 to 5% by weight of a halogen compound is added to the mixture.

7. The process for producing high purity silicon carbide powder used for preparation of a silicon carbide single crystal according to claim 4, wherein 0.5 to 5% by weight of a halogen compound is added to the mixture.

8. The process for producing high purity silicon carbide powder used for preparation of a silicon carbide single crystal according to claim 6, wherein 1 to 5% by volume of a halogen or a hydrogen halide is added to the non-oxidizing atmosphere in the calcination in the step of forming silicon carbide, and the silicon carbide powder obtained after the step of post-treating silicon carbide has a content of each impurity element of 0.3 ppm or less.

9. The process for producing high purity silicon carbide powder used for preparation of a silicon carbide single crystal according to claim 2, wherein, while the mixture is calcined in a non-oxidizing atmosphere in the step of forming silicon carbide, a constant stream of a non-oxidizing gas is passed through a heating furnace used for calcining the mixture, and a gas mixture containing SiO and CO formed during the calcination is removed from the heating furnace with the stream of a non-oxidizing gas.

10. The process for producing high purity silicon carbide powder used for preparation of a silicon carbide single crystal according to claim 8, wherein, while the mixture is calcined in a non-oxidizing atmosphere in the step of forming silicon carbide, a constant stream of a non-oxidizing gas is passed through a heating furnace used for calcining the mixture, and a gas mixture containing SiO and CO formed during the calcination is removed from the heating furnace with the stream of a non-oxidizing gas.

11. A process for producing high purity silicon carbide powder used for preparation of a silicon carbide single crystal comprising:

a step of forming silicon carbide in which silicon carbide powder is prepared by heat curing a mixture obtained by homogeneously mixing a silicon source which is one or more types selected from a tetraalkoxysilane, a tetraalkoxysilane oligomer, and/or silicon oxide, and contains 20 ppm or less of impurities, and a carbon source which is one or more types selected from a resol-type phenol resin and/or a novolak-type phenol resin, and by subsequently calcining the heat cured mixture in a non-oxidizing atmosphere; and a step of post-treating silicon carbide in which the silicon carbide powder thus prepared is treated by heating at a temperature of 2000° to 2100° C. for 5 to 20 minutes twice or more intermittently with an interval which is twice or more as long as the period of the treatment by heating at a temperature of 2000° to 2100° C. while the silicon carbide powder is kept at a temperature of 1700° or higher to lower than 2000° C., to obtain silicon carbide powder having an average particle diameter of 10 to 500 μm and a content of impurity elements of 0.5 ppm or less.

12. A silicon carbide single crystal which is prepared by growing silicon carbide powder on a seed crystal with sublimation recrystallization, has a density of defects of $5 \times 10^2 / cm^2$ or less, and has a hexagonal structure or a hexagonal structure containing a rhombohedral structure as a part thereof, the silicon carbide powder being high purity silicon carbide powder for preparation of a silicon carbide single crystal prepared by the process for producing high purity silicon carbide powder for preparation of a silicon carbide single crystal described in any one of claims 1 to 11.

* * * * *